(12) United States Patent
Sharma et al.

(10) Patent No.: US 6,598,191 B1
(45) Date of Patent: Jul. 22, 2003

(54) VERIFICATION OF ASYNCHRONOUS BOUNDARY BEHAVIOR

(75) Inventors: Debendra Das Sharma, Santa Clara, CA (US); Ashish Gupta, Cupertino, CA (US); Donald A. Williamson, Cupertino, CA (US)

(73) Assignee: Hewlett-Packard Development Companay, L.P., Houston, TX (US)

( * ) Notice: Subject to any disclaimer, the term of this patent is extended or adjusted under 35 U.S.C. 154(b) by 0 days.

(21) Appl. No.: 09/444,610

(22) Filed: Nov. 23, 1999

(51) Int. Cl.[7] ............... G01R 31/3177; G01R 31/3181; G01R 31/3185
(52) U.S. Cl. .................. 714/726; 703/15; 714/724; 714/731; 714/741; 714/744
(58) Field of Search ........................ 703/15; 714/724, 714/726–728, 731

(56) References Cited

U.S. PATENT DOCUMENTS

| | | | |
|---|---|---|---|
| 4,787,062 A | | 11/1988 | Nei et al. |
| 5,014,226 A | | 5/1991 | Horstmann et al. |
| 5,054,024 A | * | 10/1991 | Whetsel ...................... 714/726 |
| 5,259,006 A | | 11/1993 | Price et al. |
| 5,390,190 A | * | 2/1995 | Nanda et al. ............... 714/727 |
| 5,418,931 A | | 5/1995 | Moorby |
| 5,475,830 A | | 12/1995 | Chen et al. |
| 5,592,493 A | * | 1/1997 | Crouch et al. ............... 714/729 |
| 5,790,836 A | | 8/1998 | Mizuno |
| 5,923,193 A | | 7/1999 | Bloch et al. |
| 6,088,821 A | | 7/2000 | Moriguchi et al. |
| 6,353,906 B1 | | 3/2002 | Smith et al. |

FOREIGN PATENT DOCUMENTS

| | | | | |
|---|---|---|---|---|
| EP | | 358376 A2 | * 3/1990 | ....... G01R/31/3185 |
| JP | | 06324113 A | * 11/1994 | |

* cited by examiner

Primary Examiner—R. Stephen Dildine (57) ABSTRACT

A function for verifying an asynchronous boundary behavior of a digital system. The asynchronous boundary is formed at a coupling between a first series of registers clocked by a write clock (the write domain), and a second series of registers clocked by a read clock (the read domain). A delay register and multiplexer are inserted after a predetermined register within the digital system, where the predetermined register and delay register are clocked by the same clock. The output of the predetermined register is coupled to both the first input of multiplexer and a first input of the delay register. The delay register is coupled to the second input of the multiplexer. A selector is coupled to the multiplexer for selecting which of the two multiplexer inputs to pass to subsequent registers in the digital system. By inserting the delay register/multiplexer at or after the asynchronous boundary, any signal level uncertainty present between the read domain and the write domain is captured and propagated through the digital system.

20 Claims, 10 Drawing Sheets

VERIFICATION OF ASYNCHRONOUS BOUNDARY BEHAVIOR

THE FIELD OF THE INVENTION

The present invention relates to digital systems, and, more particularly to an apparatus and method for verifying the asynchronous boundary behavior of a digital system, such as a computer system, where the asynchronous boundary is formed between two or more clock domains in the digital system.

BACKGROUND OF THE INVENTION

Today's digital systems, such as computer systems, often incorporate multiple clock domains within their designs. When multiple clock domains exist within a digital system, asynchronous boundaries are formed between adjacent clock domains. Signals crossing an asynchronous boundary from a write clock domain to a read clock domain are typically synchronized through a series of registers (e.g., flip-flops) in the read clock domain before being used. This is done to avoid a condition known as metastability.

Metastability occurs if the clock in the read domain transitions at approximately the same time as the input signal from the write domain transitions. As an example, the read domain may read one or more input signals from the write domain that are at an indeterminate voltage level which is neither a logical "0" voltage level nor a logical "1" voltage level. The synchronizing flip-flops in the read domain bring the input signals to a consistent logical "0" or logical "1" state before the signals are used in the read domain. However, the outputs generated by the synchronizing flip-flops now become non-deterministic (i.e., either a logical "0" or a logical "1") when there is a change in the input signals at approximately the same time that the clock for the read domain is transitioning (i.e., rising edge for positive edge triggered flip-flops or falling edge for negative edge triggered flip-flops).

In addition to metastability arising from asynchronous read domain and write domain clocks, signals crossing asynchronous boundaries between clock domains can have differing delays due to varying RC and loading delays, which further contributes to the metastability problem. Also, clock skew between the various synchronizing flip-flops may produce non-deterministic results at the outputs of the flip-flops.

Thus, if input signals from the write domain are transitioning just before the triggering edge of the read clock, the situation can occur where some of the input signals complete transitioning before the synchronizing flip-flop is triggered, while other input signals do not complete transitioning before the synchronizing flip-flop is triggered, due to high RC delays and/or clock skew. As a result, the latest values of some input signals from the write domain are propagated to the read domain, while old values of other input signals are propagated.

Verification of digital systems having asynchronous boundaries as a result of multiple clock domains poses serious problems for existing verification tools. A simulator for simulating a digital system which is typically written in a hardware description language (HDL), such as Verilog or VHDL cannot effectively model signal transitions at asynchronous boundaries. The simulations controlled by the simulators are digital in nature with a strict notion of events (e.g., signal transitions) happening only at precise time intervals. However, because of conditions described above (i.e., RC delays and/or clock skew) signal transitions do not occur at the precise time intervals utilized by the simulators. Thus, simulators fail to capture the uncertainty inherent in digital systems having asynchronous boundaries. Rather than capturing the actual behavior (i.e., some signals have transitioned to the new state, while other signals have not yet transitioned to a new state), the simulators assign either the pre-transition state to all of the signals, or the post-transition state to all of the signals.

Most simulators allow delay behavior to be modeled to delay the transition by a predetermined amount of time. Nevertheless, the delay signals modeled are still deterministic since at the end of the predetermined delay period, the signals transition instantly.

A hardware emulator is a software module whose behavior matches the corresponding digital system, but whose implementation is simpler than a hardware model. A hardware emulator can be written in any number of programming languages, such as C, C++, and PASCAL, and can be written in a hardware description language, such as Verilog and VHDL; Unlike hardware models, hardware emulators do not suffer from constraints of the physical implementation, such as silicon area. Hardware emulators also have no obligation to meet any physical constraints. Hardware emulators are capable of modeling some of the uncertainty associated with metastability. However, the uncertainty imposed due to RC delays and clock skews cannot be modeled accurately, since the actual values depend on the final layout of the chip and other fabrication parameters.

In view of the above, there is a need for an apparatus and a method to verify the asynchronous boundary behavior of a digital system, where the asynchronous boundary is formed between two or more clock domains in the digital system. The apparatus and method preferably captures and propagates any signal uncertainty present at the asynchronous boundary. The apparatus and method preferably operates correctly in digital systems where the two or more clock domains operate on the same frequency or different frequencies. Finally, the apparatus and method preferably is capable of operating within all clock domains of the digital system.

SUMMARY OF THE INVENTION

The present invention provides an apparatus for verifying the functional behavior of a digital system. The digital system includes a first series of interconnected registers clocked by a first clock and a second series of interconnected registers clocked by a second clock. An asynchronous boundary is formed at a coupling between the first series of interconnected registers and the second series of interconnected registers. The apparatus includes a delay register, which is coupled to an output of a predetermined register. The predetermined register is predetermined from a group of registers including the last register of the first group of interconnected registers and all registers from the second group of interconnected registers. The delay register is clocked by the same clock as the predetermined register. The apparatus also includes a multiplexer. The multiplexer includes at least two multiplexer inputs coupled to the output of the predetermined register and an output of the delay register. The multiplexer also includes a multiplexer output coupled to an input of a next register in the second series of interconnected registers. Finally, the multiplexer includes a multiplexer input selector, and a selector coupled to the multiplexer input selector for selecting which of the at least two multiplexer inputs to pass through to the multiplexer output.

In one embodiment of the present invention, the selector is a pseudo-random signal generator. In one embodiment, the pseudo-random signal generator is disabled if a triggering edge of the first clock occurs at least a predetermined time interval from the triggering edge of the second clock. The first clock and the second clock operate at approximately the same frequency.

The present invention also provides an apparatus for verifying an asynchronous boundary behavior of a digital system, the digital system including a first register clocked by a first clock, and a second register clocked by a second clock. The apparatus includes a delay register coupled to an output of the first register, wherein the delay register is clocked by the first clock. The apparatus further includes a multiplexer. The multiplexer includes at least two multiplexer inputs, the first multiplexer input coupled to the output of the first register and the second multiplexer input coupled to an output of the delay register. The multiplexer also includes a multiplexer output coupled to an input of the second register. Finally, the multiplexer includes a multiplexer input selector, and a selector coupled to the multiplexer input selector for selecting which of the at least two multiplexer inputs to pass through to the multiplexer output.

The present invention also provides an apparatus for verifying an asynchronous boundary behavior of a digital system, the digital system including a first register clocked by a first clock, and a series of second registers clocked by a second clock. The apparatus includes a delay register coupled to an output of one of the series of second registers, where the delay register is clocked by the second clock. The apparatus also includes a multiplexer. The multiplexer includes at least two multiplexer inputs, the first multiplexer input coupled to the output of the one of the series of second registers and the second multiplexer input coupled to an output of the delay register. The multiplexer also includes a multiplexer output coupled to an input of a next register in the series of second registers. Finally, the multiplexer includes a multiplexer input selector and a selector coupled to the multiplexer input selector for selecting which of the at least two multiplexer inputs to pass through to the multiplexer output.

The present invention also provides an apparatus for verifying the functional behavior of a digital system. The digital system includes a series of registers, wherein the series of registers includes a first register clocked by a first clock coupled to a second register clocked by a second clock. The apparatus includes a delay register coupled to an output of a predetermined register. The predetermined register is predetermined from the group comprising the first register and all registers following the first register in the series of registers. The delay register is clocked by the same clock as the predetermined register. The apparatus includes a multiplexer. The multiplexer includes at least two multiplexer inputs coupled to the output of the predetermined register and an output of the delay register. The multiplexer also includes a multiplexer output coupled to a register following the predetermined register in the series of registers. Finally, the multiplexer includes a multiplexer input selector and a selector coupled to the multiplexer input selector for selecting which of the at least two multiplexer inputs to pass through to the multiplexer output.

The present invention further provides a method for verifying an asynchronous boundary behavior of a digital system. The digital system includes a first series of interconnected registers clocked by a first clock and a second series of interconnected registers clocked by a second clock. An asynchronous boundary is formed at a coupling between the first series of interconnected registers and the second series of interconnected registers. The method begins by coupling a delay register to an output of a predetermined register. The predetermined register is predetermined from a group of registers including the last register of the first group of interconnected registers and all registers from the second group of interconnected registers. Next, at least two inputs of a multiplexer are coupled to the output of the predetermined register and an output of the delay register. An output of the multiplexer is then coupled to an input of a next register in the second series of registers. A selector is coupled to an output of the multiplexer for selecting which of the multiplexer inputs to pass through to the multiplexer output. The delay register is then clocked by the same clock used to clock the predetermined register, and the selector is activated to selected which of the at least two multiplexer inputs to pass though to the multiplexer output.

Finally, the present invention provides a computer readable medium containing instructions for controlling a computer system to perform a method for verifying the functional behavior of a digital system. The digital system includes a first series of interconnected registers clocked by a first clock and a second series of interconnected registers clocked by a second clock. An asynchronous boundary is formed at a coupling between the first series of interconnected registers and the second series of interconnected registers. The method begins by coupling at least two inputs of a multiplexer to the output of the predetermined register and an output of the delay register. Next an output of the multiplexer is coupled to an input of a next register in the second series of registers. A selector is then coupled to the multiplexer for selecting which of the multiplexer inputs to pass through to the multiplexer output. The delay register is clocked by the same clock used to clock the predetermined register. Finally, the selector is activated to select which of the multiplexer inputs to pass through to the multiplexer output.

The present invention offers several advantages over current verification systems for verifying the functional behavior of a digital system. The present invention provides a capability to correctly capture the uncertainty present in signals passing between independently clocked domains. The present invention is simple, requiring only a delay register, a multiplexer, and a signal selector for the multiplexer. The present invention can be inserted within any clocked domain. Finally, the present invention may be deployed in a variety of applications, including: simulation, formal verification, hardware emulation, and post-silicon verification.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
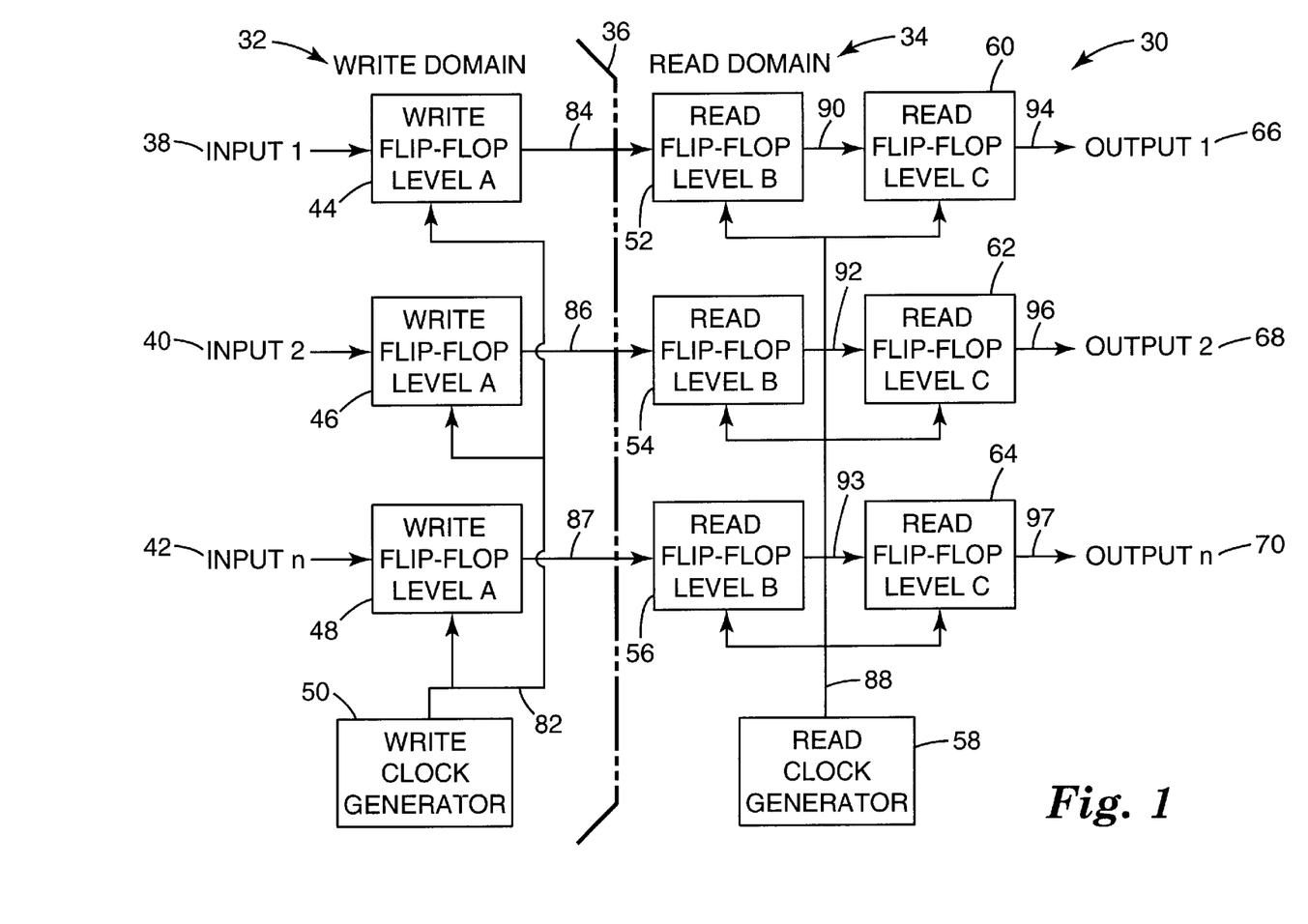
FIG. 1 is a first schematic block diagram of a model having separately clocked read and write domains forming an asynchronous boundary between the domains.

FIG. 1 illustrates in schematic block diagram form a model 30 having a separately clocked write domain 32 and a separately clocked read domain 34 adjacent to write domain 32. An asynchronous boundary 36 is formed between domains 32 and 34. Write domain 32 includes a set of system inputs 38, 40, and 42 connected to a corresponding set of inputs of write flip flops 44, 46, and 48. A write clock generator 50 provides a write clock signal 82 for write flip flops 44, 46, and 48. In one embodiment of the present invention, write flip flops 44, 46, and 48 are triggered by a positive edge of a write clock signal 82 generated by write clock generator 50.

Outputs of write flip flops 44, 46, and 48 are coupled to corresponding inputs of first level read flip flops 52, 54, and 56 in read domain 34, via signal WFFA1 84, signal WFFA2 86, and signal WFFAN 87 respectively, crossing asynchronous boundary 36. Outputs of first level read flip flops 52, 54, and 56 are then coupled to corresponding inputs of second level read flip flops 60, 62, and 64, via signal RFFB1 90, signal RFFB2 92, and signal RFFBN 93, respectively. Outputs of second level read flip flops 60, 62, and 64 are coupled to a corresponding set of system outputs 66, 68, and 70, via signal RFFC1 94, signal RFFC2 96, and signal RFFCN 97 respectively. A read clock generator 58 provides a read clock signal 88 for both first level read flip flops 52, 54, and 56 and second level read flip flops 60, 62, and 64. In one embodiment of the present invention, first and second level read flip flops 52, 54, 56, 60, 62, and 64 are triggered by a positive edge of a read clock signal 88 generated by read clock generator 58. The clock signals 82 and 88 generated by write clock generator 50 and read clock generator 58, respectively, may have the same clock frequency, or alternatively, different clock frequencies.

Figure 2:
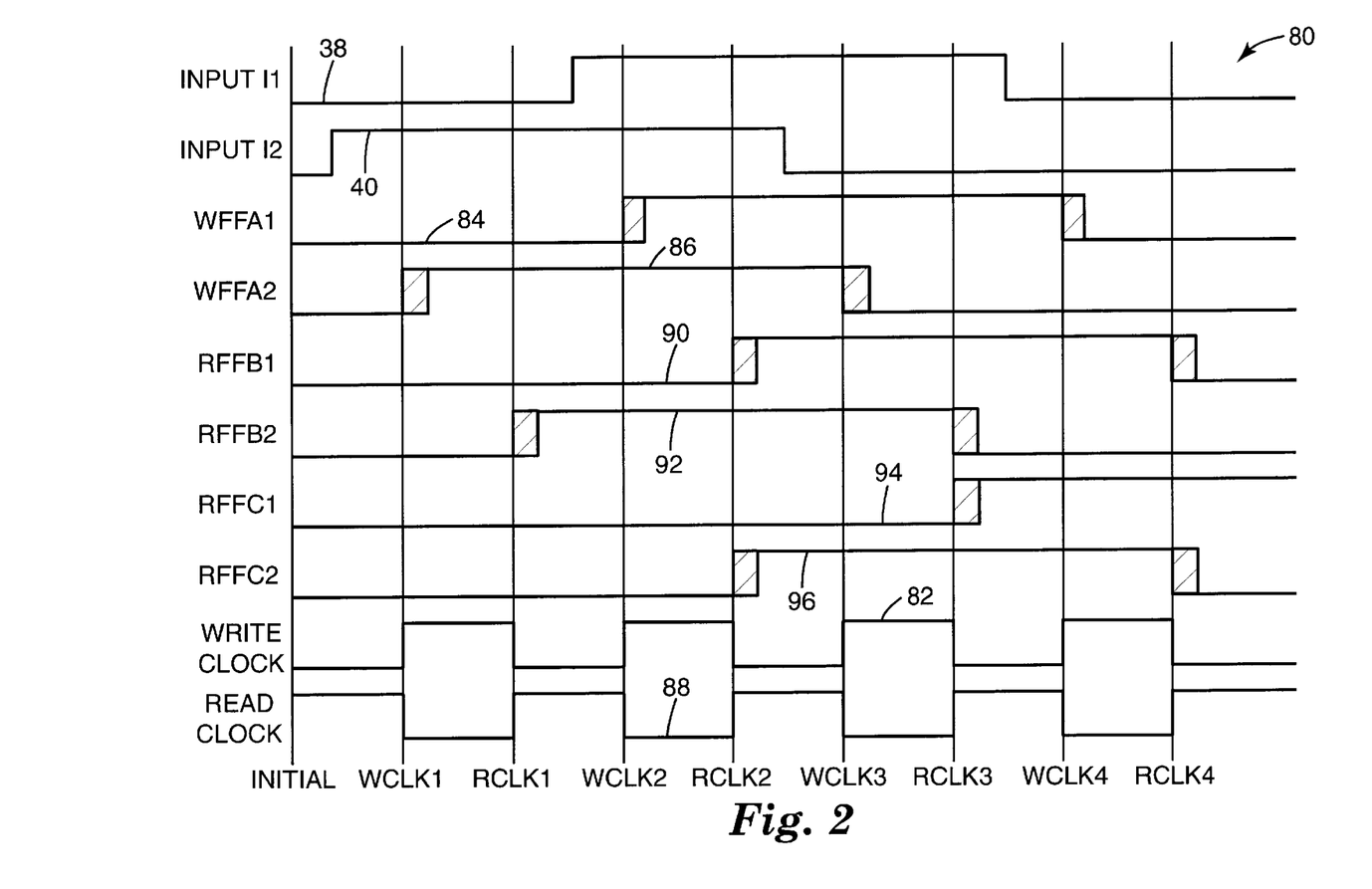
FIG. 2 is a first timing diagram illustrating a first logical operation of the model of FIG. 1, wherein no metastability condition exists between the read and write domains of the model.

FIG. 2 illustrates in timing diagram form a logical operation 80 of model 30 of FIG. 1, wherein no metastability condition exists between write domain 32 and read domain 34. The timing diagram includes the following signals: input I1 38, input I2 40, WFFA1 84, WFFA2 86, RFFB1 90, RFFB2 92, RFFC1 94, RFFC2 96, write clock 82, and read clock 88. In the timing diagram of FIG. 2, the states of WFFA1 84 and WFFA2 86 are always stable at logical "0" or logical "1" at the inputs of read flip flops 52 and 54 at the time of the positive edge trigger of read clock 88. Thus, in this example, read flip flops 52 and 54 capture with a high degree of certainty the proper value passed from write flip flops 44 and 46. Read flip flops 52 and 54 alleviate the metastability problems discussed in the Background of the Invention section of the present specification and designs may include more than two of the read domain flip flops to further alleviate the metastability problem. However, the additional read flip flops cannot provide 100% certainty that the proper value will be captured from write flip flops 44 and 46.

The below Table I further represents, in tabular format, the logical values of the system inputs and read/write flip flops at each positive edge transition of write clock 82 and read clock 88 for logical operation 80 of model 30 illustrated in the timing diagram of FIG. 2. As an example, when read clock 88 triggers first level read flip flops 52 and 54 for the first time at time RCLK1, WFFA1 84 is stable at logical state "0", and WFFA2 86 is stable at logical state "1". As a result, signal RFFB1 90 receives a value of "0" and signal RFFB2 receives a value of "1" shortly after the positive edge trigger of read clock 88 at time RCLK1. At the second positive edge of read clock 88 (i.e., at time RCLK2), second level read flip flop 60 receives a "0" value from signal RFFB1 90, and second level read flip flop 62 receives a value of "1" from signal RFFB2 92.

In this example, all input transitions at the inputs to read flip flops 52 and 54 have stabilized to a logical "0" or logical "1" by the time of a read clock 82 trigger. Thus, no logical state uncertainty is introduced at the asynchronous boundary 36 formed between write domain 32 and read domain 34. The flip-flops in the examples represented in the following Tables I–V are initiated to logical "0" values. There are, however, numerous other example initialization scenarios, such as all flip-flops being initialized to logical "1" or all flip-flops not being initialized to any particular logical value so that initially all flip-flops are non-determinate values (i.e., either a logical "0" or a logical "1" value).

TABLE I

|  | Input | WFF (level A) | RFF (level B) | RFF (level c) |
|---|---|---|---|---|
| Initial | I1=0 | I1=0 | I1=0 | I1=0 |
|  | I2=0 | I2=0 | I2=0 | I2=0 |
| WCLK1 | I1=0 | I1=0 | I1=0 | I1=0 |
|  | I2=1 | I2=0→1 | I2=0 | I2=0 |
| RCLK1 | I1=0 | I1=0 | I1=0 | I1=0 |
|  | I2=1 | I2=1 | I2=0→1 | I2=0 |
| WCLK2 | I1=1 | I1=0→1 | I1=0 | I1=0 |
|  | I2=1 | I2=1 | I2=1 | I2=0 |
| RCLK2 | I1=1 | I1=1 | I1=0→1 | I1=0 |
|  | I2=1 | I2=1 | I2=1 | I2=0→1 |

TABLE I-continued

| | Input | WFF (level A) | RFF (level B) | RFF (level c) |
|---|---|---|---|---|
| WCLK3 | I1=1<br>I2=0 | I1=1<br>I2=1→0 | I1=1<br>I2=1 | I1=0<br>I2=1 |
| RCLK3 | I1=1<br>I2=0 | I1=1<br>I2=0 | I1=1<br>I2=1→0 | I1=0→1<br>I2=1 |
| WCLK4 | I1=0<br>I2=0 | I1=1→0<br>I2=0 | I1=1<br>I2=0 | I1=1<br>I2=1 |
| RCLK4 | I1=0<br>I2=0 | I1=0<br>I2=0 | I1=I→0<br>I2=0 | I1=1<br>I2=1→0 |

Figure 3:
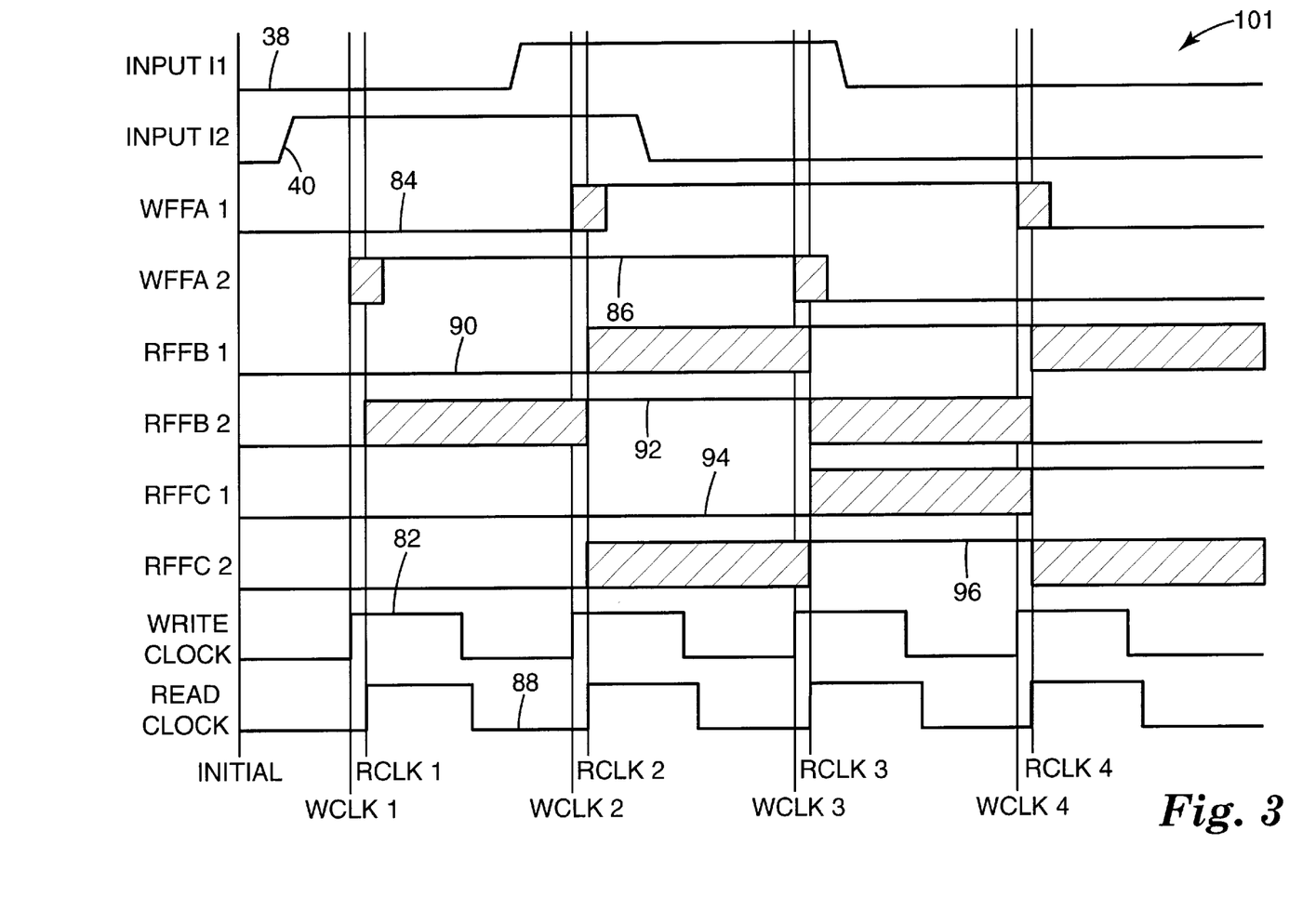
FIG. 3 is a second timing diagram illustrating a second logical operation of the model of FIG. 1, wherein a metastability condition exists between the read and write domains of the model.

FIG. 3 illustrates in timing diagram form a logical operation 101 of model 30 of FIG. 1, where a metastability condition exists between write 10 domain 32 and read domain 34. The timing diagram includes the following signals: input I1 38, input I2 40, WFFA1 84, WFFA2 86, RFFB1 90, RFFB2 92, RFFC1 94, RFFC2 96, write clock 82, and read clock 88. In this example, there is a shorter time interval between the triggering edge of write clock signal 82 and the triggering edge of the read clock signal 88 than was present in FIG. 2. As a result, the logic states of WFFA1 84 and WFFA2 86 may be indeterminate at the time read clock signal 88 triggers read flip flops 52 and 54.

As an example, when write flip flop 44 is triggered for the first time at WCLK1, input signal "I1" 38 has been stable at logical "0" for at least one clock cycle. As a result, signal WFFA1 84 does not transition, and first level read flip flop 52 properly captures a determinate logical value of "0" at time RCLK1. In contrast to input signal "I1", input signal "I2" 40 transitions from logical "0" to logical "1" prior to the first write clock trigger (WCLK1). As a result, signal WFFA2 86 (i.e., the output of write flip flop 46) must transition from a logical "0" state to a logical "1" state after WCLK1. As described previously, the first read clock trigger (RCLK1) very closely follows the first write clock trigger (WCLK1) in this example. Thus, signal WFFA2 86 is still transitioning from logical "0" to logical "1" at time of the first read clock trigger (RCLK1), so the value captured by first level read flip flop 52 is indeterminate (i.e., it may contain a logical "0" (the "old" value) or a logical "1" (the "new" value)). As described previously, simulators currently in use are unable to capture this uncertainty properly.

In current simulators, first level read flip flop 52 will always capture the "old" value ("0") or first level read flip flop 52 will always capture the "new" value ("1"). In reality, first level read flip flop 52 should capture a mixture of "old" values ("0") and "new" values ("1") to properly model the indeterminate state transition.

Figure 4:
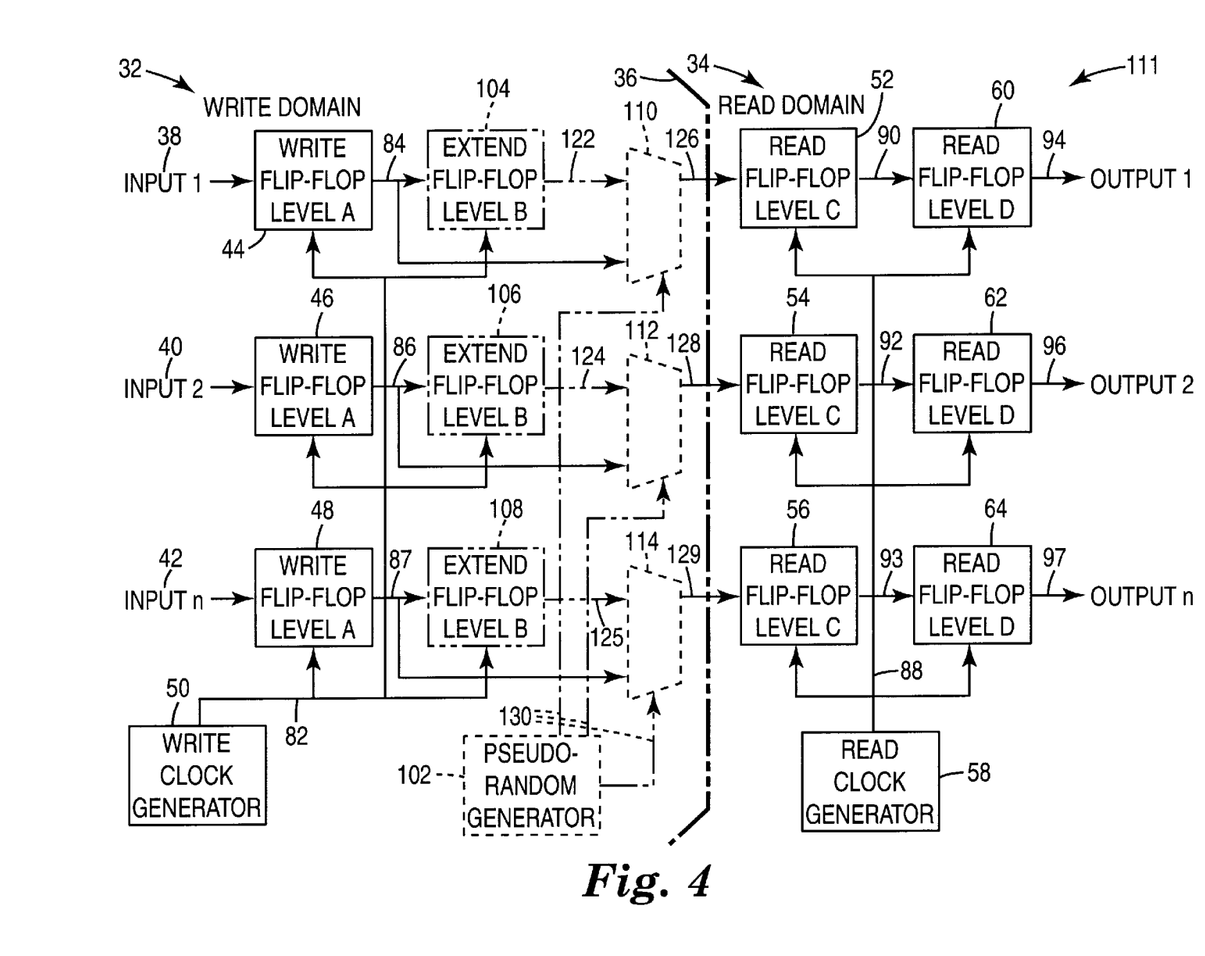
FIG. 4 is a second schematic block diagram of a model having separately clocked read and write domains, wherein additional logic in accordance with the present invention has been inserted in the write domain to allow proper verification of the asynchronous boundary behavior between the domains.

FIG. 4 illustrates in schematic block diagram form a model 111 having a separately clocked write domain 32 and a separately clock read domain 34, adjacent to write domain 32, wherein additional logic has been inserted in write domain 32 to allow proper verification of the asynchronous boundary behavior between the domains.

As in FIG. 1, write domain 32 includes a set of system inputs 38, 40, and 42 connected to a corresponding set of inputs of write flip flops 44, 46, and 48. In addition to write flip flops 44, 46, and 48, write domain also includes a set of extend (delay) flip flops 104, 106, and 108 connected to the outputs of write flip flops 44, 46, and 48 via signal WFFA1 84, signal WFFA2 86, and signal WFFAN 87, respectively. A set of multiplexers 110, 112, and 114 are also connected to the outputs of write flip flops 44, 46, and 48 via signal WFFA1 84, signal WFFA2 86, and WFFAN 87, respectively. Multiplexers 110, 112, and 114 are also connected to the outputs of extend flip flops 104, 106, and 108 via signal XFFB1 122, signal XFFB2 124, and XFFBN 125. Thus, each multiplexer has a first input connected to the output signal of a write flip flop, and a second input connected to the output signal of an extend flip flop.

A write clock generator 50 provides a write clock 82 for write flip flops 44, 46, and 48 and extend flip flops 104, 106, and 108. In one embodiment of the present invention, a pseudo random generator 102 is connected to multiplexers 110, 112, and 114 via multiplexer signal 130 in order to select which of the two multiplexer inputs to pass to the multiplexer output. Each multiplexer output is connected to a corresponding input of a first level read flip flop 52, 54, and 56 in read domain 34 via signal MUX1 126, MUX2 128, and MUXN 129.

The extend flip flops 104, 106, and 108 serve to retain the "old" value of write flip flops 44, 46, and 48 for one additional clock cycle while the write flip flops receive a "new" value. Multiplexers 110, 112, and 114 are inserted to select either the "old" value stored in extend flip flops 104, 106, and 108 or the "new" value stored in write flip flops 44, 46, or 48 to pass from write domain 32 to the input of read flip flops 52, 54, and 56 in read domain 34. This effectively models the uncertainty during a transition of the write flip-flop. For example, if write flip-flop 44 transitions from a logical "0" to a logical "1" during WCLK2, the value registered during the next read clock is determinate.

Inserting the extend flip flops and multiplexers within the logic of the write domain becomes especially important where write flip flops 44, 46, and 48 are triggered by write clock signal 82 just before read flip flops 52, 54, and 56 are triggered by read clock signal 88, as previously illustrated in FIG. 3. Because signals crossing asynchronous boundary 36 may be transitioning from one logical state to another at the time read flip flop 52, 54, and 56 triggers, it is indeterminate whether the signal has completed transitioning before the signal state is captured by read flip flop 52, 54, and 56 in read domain 34. Under the scenario of FIG. 3, read flip flops 52, 54, and 56 capture either the "old" values of write flip flops 44, 46, and 48 or the "new" values of write flip flops 44, 46, and 48, but not a mixture of both "old" and "new" values. By adding extend flip flops 104, 106, and 108 to the outputs of write flip flops 44, 46, and 48, both the "new" and "old" signal states of write flip flops 44, 46, and 48 are retained in write domain 32. Multiplexer selector signal 130 then selects whether the "old" signal state or the "new" signal state is to be passed across asynchronous boundary 36 to read flip flops 52, 54, and 56 on a signal by signal basis. In the illustrated embodiment, this selection is driven in a pseudo-random manner. Thus, read flip flops 52, 54, and 56 receive a random collection of both "old" and "new" values for transitioning signals, which more accurately reflects what occurs in the actual digital system during operation.

The outputs of first bank of read flip flops 52, 54, and 56 are coupled to corresponding inputs of a second set of read flip flops 60, 62, and 64 via signal RFFC1 90, signal RFFC2 92, and signal RFFCN 93, respectively. A read clock generator 58 provides a clocking signal for both first set of read flip flops 52, 54, and 56 and second set of read flip flops 60, 62, and 64. In one embodiment of the present invention, read flip flops 52, 54, 56, 60, 62, and 64 are triggered by a positive edge of read clock signal 82 generated by read clock generator 58. The clock signals 82 and 88 generated by write clock generator 50 and read clock generator 58 may have the same clock frequency, or alternatively, different clock frequencies.

Figure 5:
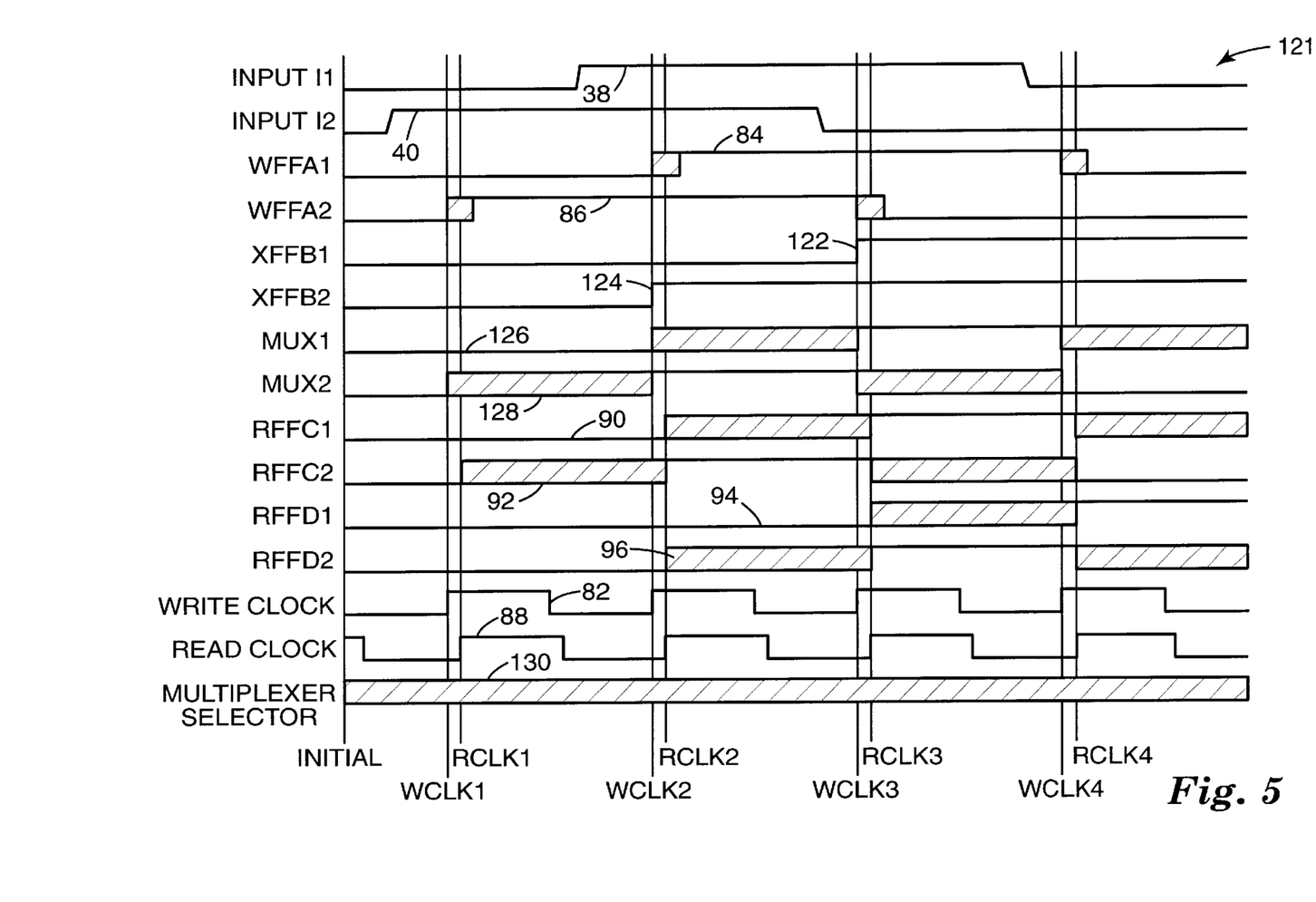
FIG. 5 is a first timing diagram illustrating a first logical operation of the model of FIG. 4, wherein the read domain clock and the write domain clock of the model operate on approximately the same frequency.

FIG. 5 illustrates in timing diagram form a logical operation 121 of model 111 of FIG. 4., wherein the write domain clock 82 and the read domain clock 88 of the model operate on approximately the same frequency. The timing diagram includes the following signals: input I1 38, input I2 40, WFFA1 84, WFFA2 86, XFFB1 122, XFFB2 124, MUX1 126, MUX2 128, RFFC1 90, RFFC2 92, RFFD1 94, RFFD2 96, write clock 82, read clock 88, and multiplexer selector 130. In this example, there is a short time interval between the triggering edge of write clock 82 and the triggering edge of read clock 88. As a result, the logic states of signal WFFA1 84 and signal WFFA2 86 may be indeterminate at the time read clock 88 triggers read flip flops 52 and 54.

The below Table II further represents, in tabular format, the logical values of the system inputs and read/write flip flops at each positive edge transition of write clock 82 and read clock 88 for logical operation 121 of model 111 illustrated in the timing diagram of FIG. 5. As described previously in FIG. 3, when write flip flop 44 is triggered for the first time at WCLK1, input signal "I1" 38 has been stable at logical "0" for at least one clock cycle. As a result, signal WFFA1 84 does not transition, and first level read flip flop 52 properly captures a determinate logical value of "0" at time RCLK1. In contrast to input signal "I1" 38, input signal "I2" 40 transitions from logical "0" to logical "1" just prior to the first write clock trigger (WCLK1). As a result, signal WFFA2 86 transitions from a logical "0" to a logical "1" after WCLK1. In the illustrated example, the first read clock trigger (RCLK1) very closely follows the first write clock trigger (WCLK1). Thus, signal WFFA2 86 is still transitioning from logical "0" to logical "1" at time of RCLK1, so the value captured by first level read flip flop 52 is indeterminate (i.e., it may contain a logical "0" (the "old" value) or a logical "1" (the "new" value)) of the write flip flop.

As described previously, simulators currently in use are unable to capture this uncertainty properly. In current simulators, first level read flip flop 52 always captures the "old" value ("0") or first level read flip flop 52 always captures the "new" value ("1").

By introducing extend flip flops 104, 106 and 108 and multiplexers 110, 112 and 114 into write domain 32 (as previously illustrated in FIG. 4), the signal state uncertainty between the read and write domains can be satisfactorily modeled and propagated though the remaining flip flops of the digital system. Instead of always capturing the "old" value, or always capturing the "new" value of the transitioning output signal from write flip flop 44, 46, and 48, multiplexer 110, 112, and 114 enables a pseudo random selection of either the "new" value from write flip flop 44, 46, and 48 or the "old" value from extend flip flop 104, 106, and 108.

Thus, at time RCLK1, read flip flop 52 captures either signal WFFA1 84, or signal XFFB1 122, depending upon the pseudo random state of multiplexer selector 130. In this way, the uncertainty present between the write and read domains is properly modeled and propagated through the digital system. In a similar manner, read flip flop 54 captures either signal WFFA2 86, or signal XFFB2 124, depending upon the pseudo random state of multiplexer selector 130.

TABLE II

| Input | Input | WFF (level A) | Extend FF (level B) | Mux | RFF (level C) | RFF (level D) |
|---|---|---|---|---|---|---|
| Initial | I1=0 | I1=0 | I1=0 | I1=0 | I1=0 | I1=0 |
|  | I2=0 | I2=0 | I2=0 | I2=0 | I2=0 | I2=0 |
| WCLK1 | I1=0 | I1=0 | I1=0 | I1=0 | I1=0 | I1=0 |
|  | I2=1 | I2=0→1 | I2=0 | I2=0→1/0 | I2=0 | I2=0 |
| RCLK1 | I1=0 | I1=0 | I1=0 | I1=0 | I1=0 | I1=0 |
|  | I2=1 | I2=0→1 | I2=0 | I2=0→1/0 | I2=0→1/0 | I2=0 |
| WCLK2 | I1=1 | I1=0→1 | I1=0 | I1=0→1/0 | I1=0 | I1=0 |
|  | I2=1 | I2=1 | I2=0→1 | I2=1/0→1 | I2=0→1/0 | I2=0 |
| RCLK2 | I1=1 | I1=0→1 | I1=0 | I1=0→1/0 | I1=0→1/0 | I1=0 |
|  | I2=1 | I2=1 | I2=1 | I2=1 | I2=1 | I2=0→1/0 |
| WCLK2 | I1=1 | I1=1 | I1=0→1 | I1=1/0→1 | I1=0→1/0 | I1=0/0 |
|  | I2=0 | I2=1→0 | I2=1 | I2=1→0/1 | I2=1 | I2=0→1/0 |
| RCLK3 | I1=1 | I1=1 | I1=1 | I1=1 | I1=1 | I1=0→1/0 |
|  | I2=0 | I2=1→0 | I2=1 | I2=1→0/1 | I2=1→0/1 | I2=1 |
| WCLK4 | I1=0 | I1=1→0 | I1=1 | I1=1→0/1 | I1=1 | I1=0→1/0 |
|  | I2=0 | I2=0 | I2=1→0 | I2=0/1→0 | I2=1→0/1 | I2=1/0→1 |
| RCLK4 | I1=0 | I1=1→0 | I→=1 | I1=1→0/1 | I1=1→0/1 | I1=1 |
|  | I2=0 | I2=0 | I2=0 | I2=0 | I2=0 | I2=1→0/1 |

Figure 6:
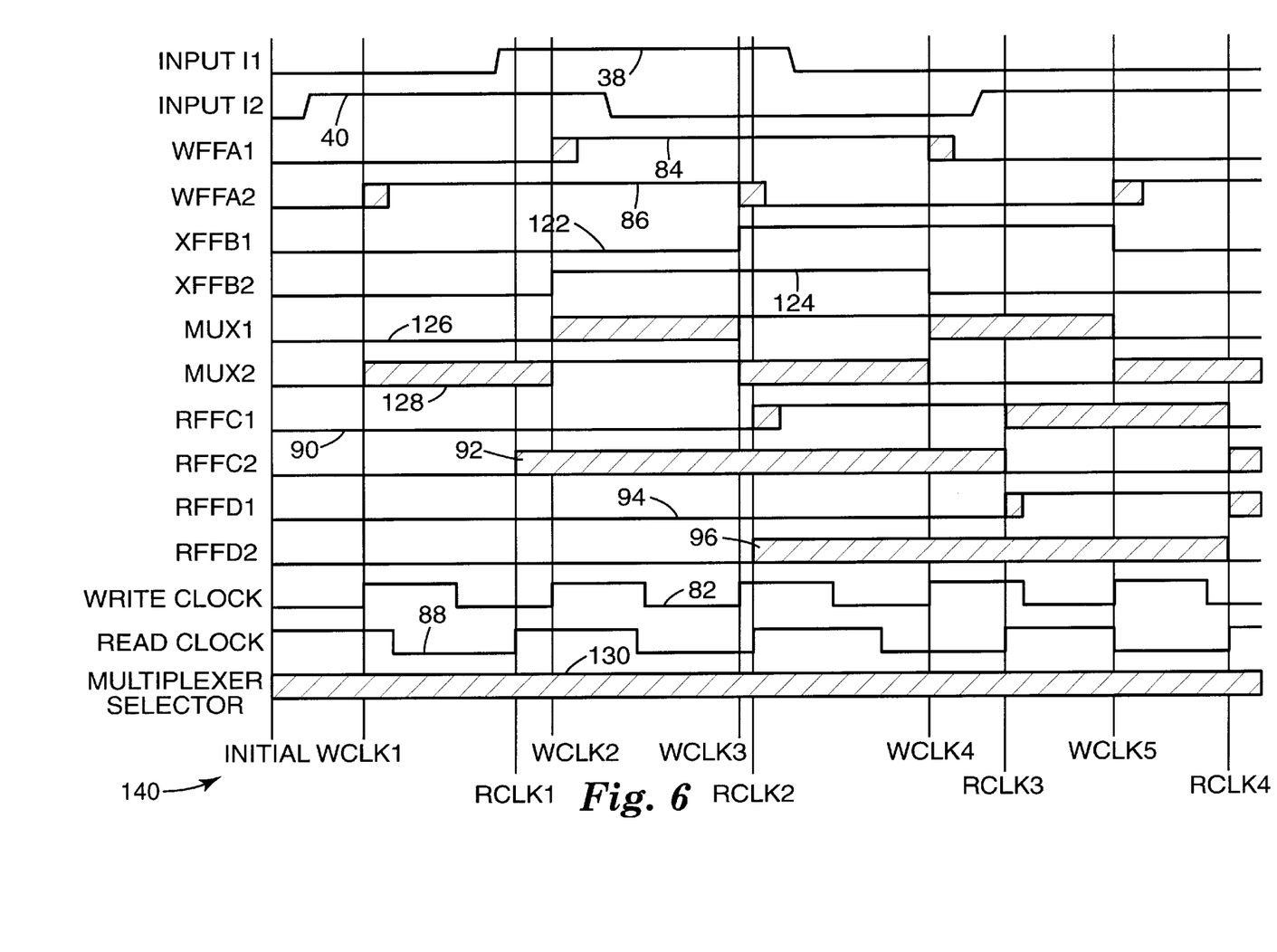
FIG. 6 is a second timing diagram illustrating a second logical operation of the model of FIG. 4, wherein the read domain clock and the write domain clock of the model operate on approximately the same frequency.

FIG. 6 illustrates in timing diagram form a logical operation 140 of model 111 of FIG. 4, wherein read clock 88 and write clock 82 of the model operate on different clock frequencies. The timing diagram includes the following signals: input I1 38, input I2 40, WFFA1 84, WFFA2 86, XFFB1 122, XFFB2 124, MUX1 126, MUX2 128, RFFC1 90, RFFC2 92, RFFD1 94, RFFD2 96, write clock 82, read clock 88, and multiplexer selector 130. Since write clock 82 and read clock 88 operate on different frequencies in the illustrated example, the triggering edges of the clocks no longer always alternate between the read clock and the write clock. That is, there may be two or more consecutive triggering edges of read clock 88 between successive triggering edges of write clock 82, or vice versa. In the illustrated example, there are two consecutive write clock triggering edges (WCLK2 and WCLK3) interspersed between two successive read clock triggering edges (RCLK1 and RCLK2).

The below Table III further represents, in tabular format, the logical values of the system inputs and read/write flip flops at each positive edge transition of write clock 82 and read clock 88 for logical operation 140 of model 111 as illustrated in the timing diagram of FIG. 6. When write flip flop 44 is triggered for the first time at WCLK1, input signal "I1" 38 has been stable at logical "0" for at least one clock cycle. As a result, signal WFFA1 84 does not transition, and first level read flip flop 52 properly captures a determinate logical value of "0" at time RCLK1. In contrast to input signal "I1" 38, input signal "I2" 40 transitions from logical "0" to logical "1" just prior to the first write clock trigger (WCLK1). As a result, signal WFFA2 86 transitions from a logical "0" to a logical "1" after WCLK1 (represented as "undefined" in the timing diagram of FIG. 6).

When write flip flop 44 is triggered for the second time at WCLK2, input signal "I1" 38 has just transitioned from logic level "0" to logic level "1". As a result, signal WFFA1 84 transitions from a logical "0" to a logical "1" after WCLK2. Input signal "I2" has remained stable at logic level "1" for at least 1 clock cycle, thus signal WFFA2 86 remains at logic level "1". Also at WCLK2, extend flip flops 104 and 106 receive the "old" values of write flip flops 44 and 46 (logical "0" and "undefined", respectively). At WCLK2, multiplexer output signal 126 receives the value of signal WFFA1 84 or signal XFFB1 122, depending upon which signal is selected by multiplexer selector 130. Signal MUX1 128 receives the value of signal WFFA2 86 or signal XFFB2 124, depending upon which signal is selected by multiplexer selector 130.

At WCLK3, input signal 38 remains at logic level "1", thus signal WFFA1 84 also remains at logic level "1". Input signal 40 transitions from logic level "1" to logic level "0" just before WCLK3, thus signal WFFA2 86 also transitions from logic level "1" to logic level "0" just after WCLK3.

At this point, write flip flops 44 and 46 and extend flip flops 104 and 106 contain both the "new" and "old" logic values. Multiplexer 110, 112, and 114, operating in conjunction with pseudo random generator 102, selects whether the "new" or "old" logic value is passed to read domain 34. Thus, even though two consecutive write clocks occur between successive read clocks in this example, both "new" and "old" write flip flop values are properly captured and passed to the read domain.

Figure 7:
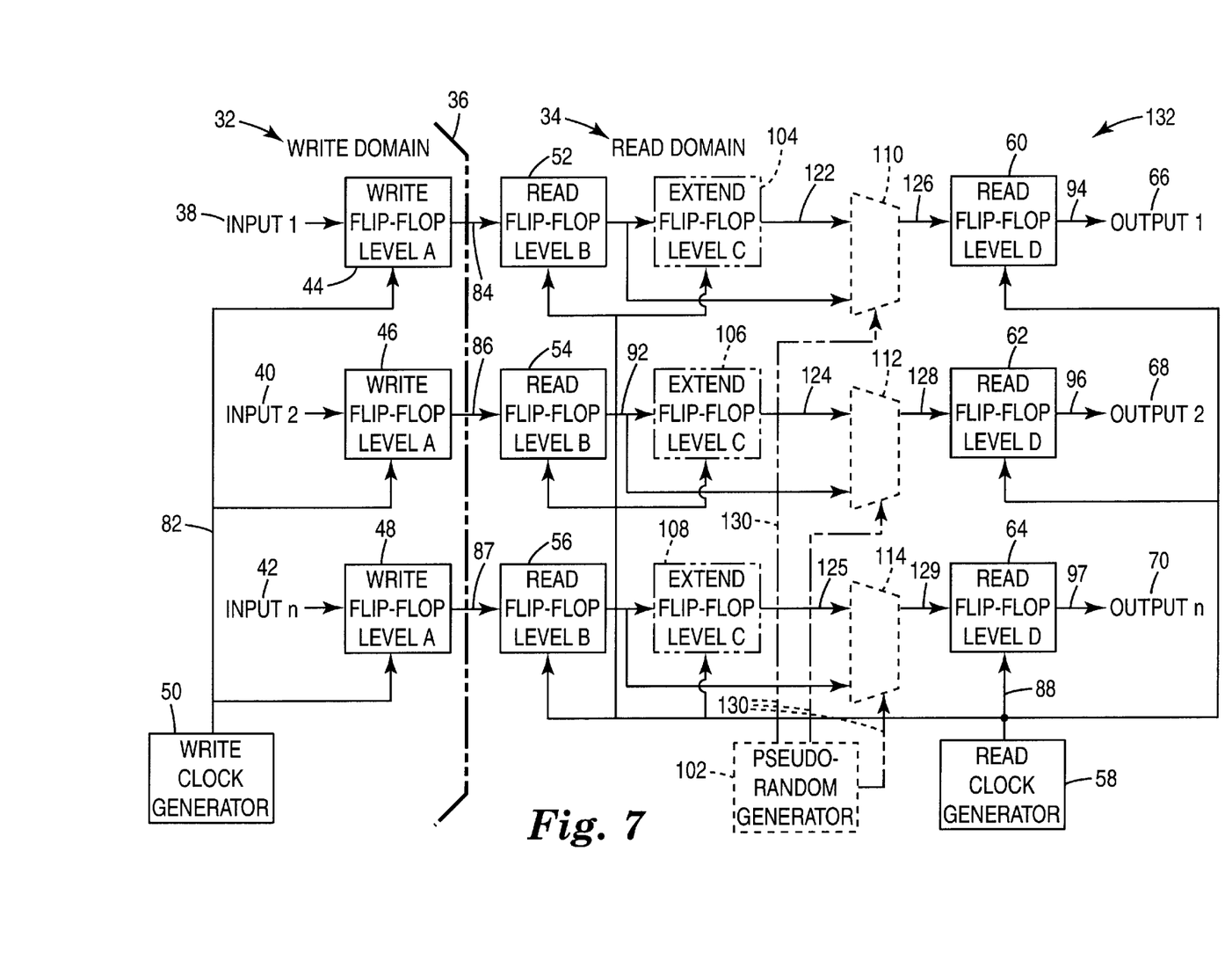
FIG. 7 is a third schematic block diagram of a model having separately clocked read and write domains, wherein additional logic in accordance with the present invention has been inserted in the read domain to allow proper verification of the asynchronous boundary behavior between the domains.

The outputs of extend flip flops are connected to corresponding inputs of multiplexers 110, 112, and 114 via signal XFFC1 122, XFFC2 124, and XFFCN 125, respectively. A multiplexer selection signal 130 is connected to multiplexers 110, 112, and 114 to select which of the two multiplexer inputs to pass to the multiplexer output. Each multiplexer output is connected to a corresponding input of a second level read flip flop 60, 62, and 64 via signal MUX1 126, MUX2 128, and MUX3 129, respectively. Outputs from second level read flip flops 60, 62, and 64 are connected to corresponding system outputs 66, 68, and 70 via signal RFFD1 94, RFFD2 96, and RFFDN 97, respectively. A read clock generator 58 provides read clock signal 88 for first level read flip flops 52, 54, and 56, second level read flip flops 60, 62, and 64, and extend flip flops 104, 106, and 108.

Inserting the extend flip flops and multiplexers into read domain 32 is useful when the hardware description language (HDL) for the digital system is already coded and the verification strategy of the present invention is performed at

TABLE III

| | Input | Extend WFF (level A) | FF (level B) | Mux | RFF (level C) | RFF (level D) |
|---|---|---|---|---|---|---|
| Initial | I1=0 | I1=0 | I1=0 | I1=0 | I1=0 | I1=0 |
| | I2=0 | I2=0 | I2=0 | I2=0 | I2=0 | I2=0 |
| WCLK1 | I1=0 | I1=0 | I1=0 | I1=0 | I1=0 | I1=0 |
| | I2=1 | I2=0→1 | I2=0 | I2=0→1/0 | I2=0 | I2=0 |
| RCLK1 | I1=1 | I1=0 | I1=0 | I1=0 | I1=0 | I1=0 |
| | I2=1 | I2=1 | I2=0 | I2=1/0 | I2=1/0 | I2=0 |
| WCLK2 | I1=1 | I1=0→1 | I1=0 | I1=0→1/0 | I1=0 | I1=0 |
| | I2=1 | I2=1 | I2=0→1 | I2=1/0→1 | I2=11/0 | I2=0 |
| WCLK3 | I1=1 | I1=1 | I1=0→1 | I1=1/0→1 | I1=0 | I1=0 |
| | I2=0 | I2=1→0 | I2=1 | I2=1→0/1 | I2=1/0 | I2=0 |
| RCLK2 | I1=1 | I1=1 | I1=1 | I1=1 | I1=0→1 | I1=0 |
| | I2=0 | I2=1→0 | I2=1 | I2=1→0/1 | I2=1→0/1 | I2=I/0 |
| WCLK4 | I1=0 | I1=1→0 | I1=1 | I1=1→0/1 | I1=1 | I1=0 |
| | I2=0 | I2=0 | I2=1→0 | I2=0/1→0 | I2=0/1 | I2=1/0 |
| RCLK3 | I1=0 | I1=0 | I1=1 | I1=0/1 | I1=1→0/1 | I1=0→1 |
| | I2=1 | I2=0 | I2=0 | I2=0 | I2=0 | I2=1→0/0→1 |
| WCLK5 | I1=0 | I1=0 | I1=1→0 | I1=0/1→0 | I1=0/1 | I1=1 |
| | I2=1 | I2=0→1 | I2=0 | I2=0→1/0 | I2=0 | I2=0/1 |
| RCLK4 | I1=0 | I1=0 | I1=0 | I1=0 | I1=0/1→0 | I1=1→0/1 |
| | I2=1 | I2=1 | I2=0 | I2=1/0 | I2=0→1/0 | I2=0/1→0 |

FIG. 7 illustrates in schematic block diagram form a model 132 having a separately clocked write domain 32 and a separately clocked read domain 34, wherein additional logic has been inserted in read domain 34 to allow proper verification of the asynchronous boundary behavior between the domains.

As previously illustrated in FIG. 1 and FIG. 4, write domain 32 includes a set of system inputs 38, 40, and 42 connected to a corresponding set of inputs of write flip flops 44, 46, and 48. Write clock generator 50 provides write clock signal 82 for write flip flops 44, 46, and 48.

In contrast to the schematic block diagram illustrated in FIG. 4, the present invention inserts the extend flip flops 104, 106, and 108 and multiplexers 110, 112, and 114 in read domain 34 rather than write domain 32. The outputs of write flip flops 44, 46, and 48 are coupled to corresponding inputs of first level read flip flops 52, 54, and 56 via signal WFFA1 84, signal WFFA2 86, and WFFAN 87, respectively. The outputs of first level read flip flops 52, 54, and 56 are coupled to the inputs of extend flip flops 104, 106, and 108 via signal RFFA1 90, RFFA2 92 and RFFAN 93, respectively. The outputs of first level read flip flops 52, 54, and 56 are also coupled to the inputs of multiplexers 110, 112, and 114 via signal RFFA1 90, RFFA2 92, and RFFAN 93, respectively.

a later time. The signals from write domain 32 may come from modules in the HDL that are different than the modules that do the synchronization. Thus, inserting extend flip flops 104, 106, and 108 and multiplexers 110, 112, and 114 in write domain 32 may cause name changes in the higher level modules which may require a significant amount of effort to work around. Therefore, it becomes a practical matter to insert the delaying flip flops (i.e., the extend flip flops) between first level flip flops 52, 54, and 56 and second level read flip flops 60, 62, and 64 in read domain 34, as illustrated in FIG. 7. By doing this, only lower level modules need to change and no name changes need to be made at the top level.

Also, if the verification feature of the present invention is desired in post-silicon verification, extend flip flops 104, 106, and 108, multiplexers 110, 112, and 114, and pseudo random number generator 102 must exist in real hardware. It may be desirable to put extend flip flops 104, 106, and 108 and multiplexers 110, 112, and 114 in read domain 32 since placing the extend flip flops and multiplexers in write domain 34 causes a combinational signal (the multiplexer output) to be synchronized which may pose other problems.

Figure 9:
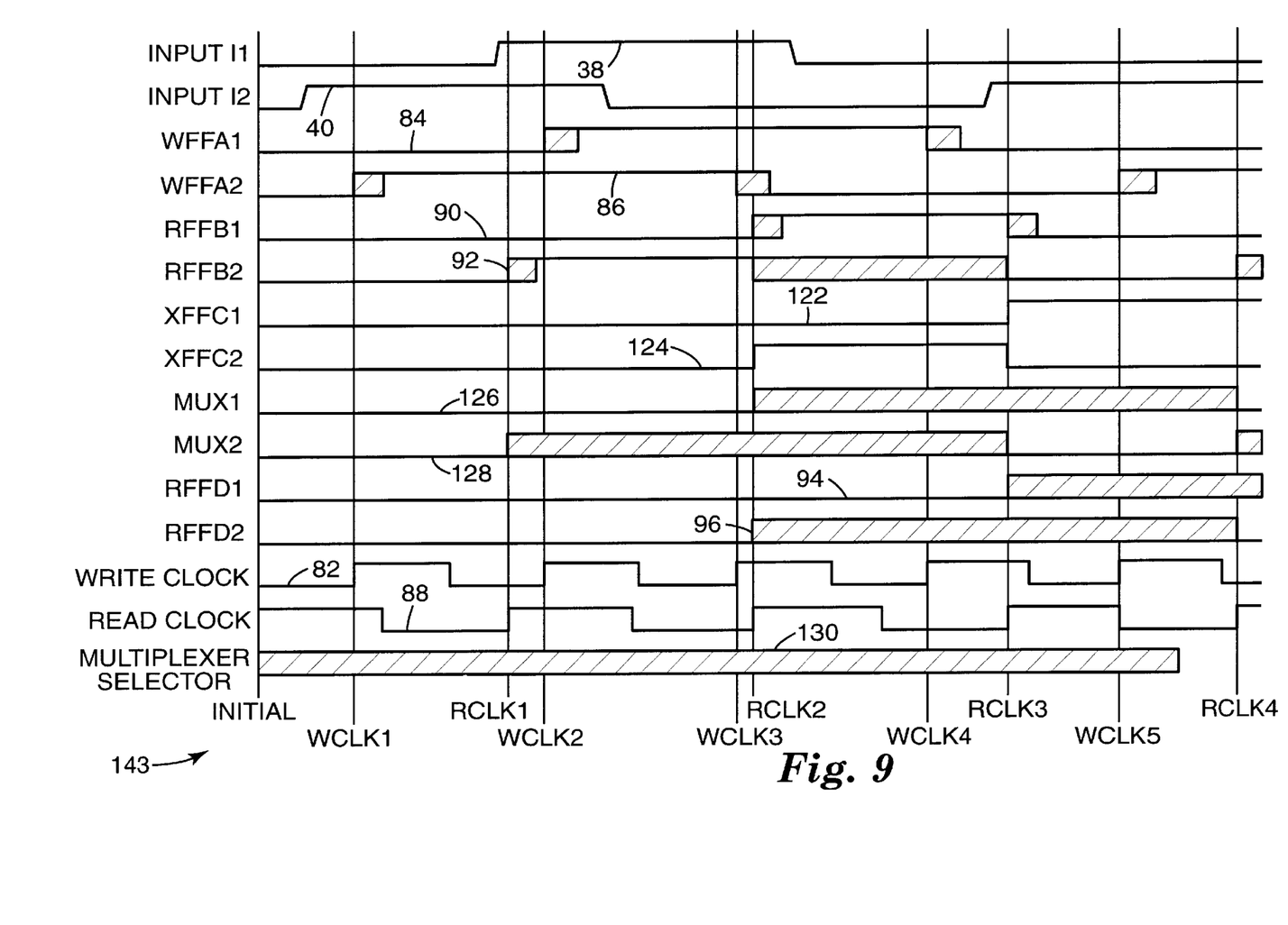
FIG. 9 is a second timing diagram illustrating a second logical operation of the model of FIG. 7, wherein the read domain clock and the write domain clock of the model operate on different frequencies.

The major drawback of placing the delaying flip flops and multiplexers in read domain 34 is that the present invention may not function properly in the case where the read clock and write clock are at different frequencies, as discussed below in FIG. 9. In the example of FIG. 9, two consecutive write clocks occur between successive read clocks.

Figure 8:
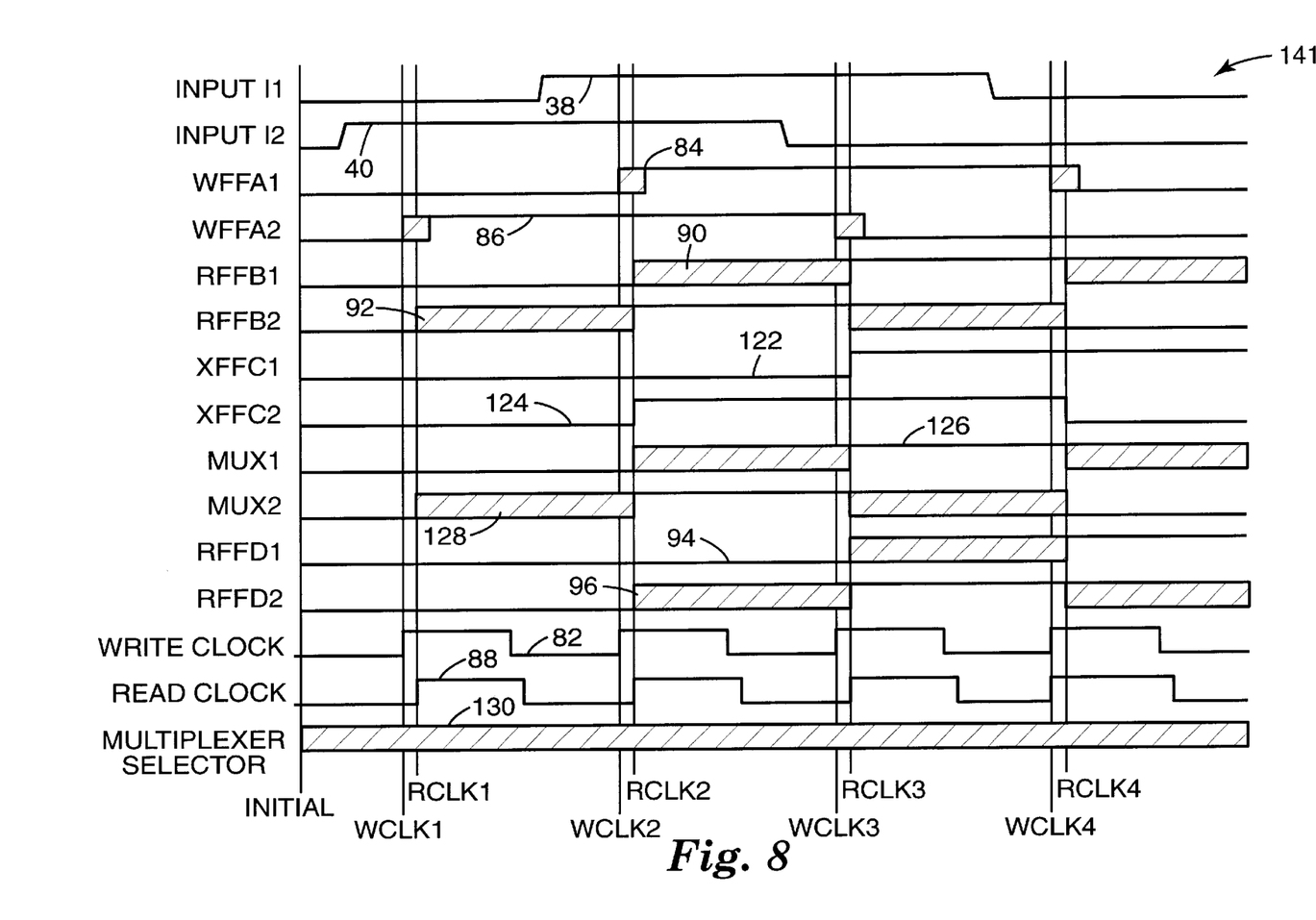
FIG. 8 is a first timing diagram illustrating a first logical operation of the model of FIG. 7, wherein the read domain clock and the write domain clock of the model operate on approximately the same frequency.

FIG. 8 illustrates in timing diagram form a logical operation 141 of model 132 of FIG. 7, wherein write domain clock 82 and write domain clock 88 of the model operate on approximately the same frequency. The timing diagram includes the following signals: input I1 38, input I2 40, WFFA1 84, WFFA2 86, RFFB1 90, RFFB2 92, XFFC1 122, XFFC2 124, MUX1 126, MUX2 128, RFFD1 94, RFFD2 96, write clock 82, read clock 88, and multiplexer selector 130. In this example, there is a short time interval between the triggering edge of write flip flop clock 82 and the triggering edge of the read flip flop clock 88. As a result, the logic states of write flip flop output signals 84 and 86 may be indeterminate at the time of read clock signal 88 triggers read flip flops 52, 54, and 56.

The below Table IV further represents, in tabular format, the logical values of the system inputs and read/write flip flops at each positive edge transition of write clock 82 and read clock 88 for logical operation 141 of model 132 as illustrated in the timing diagram of FIG. 8. As described previously in FIG. 3, when write flip flop 44 is triggered for the first time at WCLK1, input signal "I1" 38 has been stable at logical "0" for at least one clock cycle. As a result, signal WFFA1 84 does not transition, and first level read flip flop 52 properly captures a determinate logical value of "0" at time RCLK1. In contrast to input signal "I1" 38, input signal "I2" 40 transitions from logical "0" to logical "1" just prior to the first write clock trigger (WCLK1). As a result, signal WFFA2 86 (i.e., the output of write flip flop 46) transitions from a logical "0" to a logical "1" after WCLK1. As described previously, the first read clock trigger (RCLK1) very closely follows the first write clock trigger (WCLK1) in this example. Thus, signal WFFA2 86 is still transitioning from logical "0" to logical "1" at time RCLK1, so the value captured by first level read flip flop 52 is indeterminate (i.e., it may contain a logical "0" (the "old" value) or a logical "1" (the "new" value)). As described previously, simulators currently in use are unable to capture this uncertainty properly. In current simulators, first level read flip flop 52 always captures the "old" value ("0") or first level read flip flop 52 always captures the "new" value ("1") of the output signal crossing the asynchronous boundary.

By introducing extend flip flops 104, 106, and 108 and multiplexers 110, 112, and 114 into read domain 34, the state uncertainty between the read and write domains can be captured in a manner similar to that illustrated in FIG. 5. Thus, at time RCLK2, second level read flip flop 60 captures either signal RFFB1 90, or signal XFFC1 122, depending upon the selection state generated by pseudo random generator 102. In this way, the uncertainty present between the write and read domain is properly modeled and propagated through the digital system. In a similar manner, second level read flip flop 62 captures either signal RFFB2 92, or signal XFFC2 124, depending upon the selection state generated by pseudo random generator 102. As can be seen from the illustrated example and Table IV, moving the extend flip flops and multiplexer from the read to write domains does not present a problem when the read and write clocks operate at the same frequency.

TABLE IV

| Input | | WFF (level A) | RFF (level B) | Extend FF (level C) | Mux | RFF (level D) |
|---|---|---|---|---|---|---|
| Initial | I1=0 | I1=0 | I1=0 | I1=0 | I1=0 | I1=0 |
| | I2=0 | I2=0 | I2=0 | I2=0 | I2=0 | I2=0 |
| WCLK1 | I1=0 | I1=0 | I1=0 | I1=0 | I1=0 | I1=0 |
| | I2=1 | I2=0→1 | I2=0 | I2=0 | I2=0 | I2=0 |
| RCLK1 | I1=0 | I1=0 | I1=0 | I1=0 | I1=0 | I1=0 |
| | I2=1 | I2=0→1 | I2=0→1 | I2=0 | I2=0→1/0 | I2=0 |
| WCLK2 | I1=1 | I1=0→1 | I1=0 | I1=0 | I1=0 | I1=0 |
| | I2=1 | I2=1 | I2=0→1 | I2=0 | I2=0→1/0 | I2=0 |
| RCLK2 | I1=1 | I1=0→1 | I1=0→1 | I1=0 | I1=0→1/0 | I1=0 |
| | I2=1 | I2=1 | I2=1 | I2=0→1 | I2=1/0→1 | I2=0→1/0 |
| WCLK3 | I1=1 | I1=1 | I1=0→1 | I1=0 | I1=0→1/0 | I1=0 |
| | I2=0 | I2=1→0 | I2=1 | I2=1 | I2=1 | I2=0→1/0 |
| RCLK3 | I1=1 | I1=1 | I1=1 | I1=0→1 | I1=1/0→1 | I1=0→1/0 |
| | I2=0 | I2=1→0 | I2=1→0 | I2=1 | I2=1→0/1 | I2=1/0→1 |
| WCLK4 | I1=0 | I1=1→0 | I1=1 | I1=1 | I1=1 | I1=0→1/0 |
| | I2=0 | I2=0 | I2=1→0 | I2=1 | I2=1→0/1 | I2=1 |
| RCLK4 | I1=0 | I1=1→0 | I1=1→0 | I1=1 | I1=1→0/1 | I1=1/0→1 |
| | I2=0 | I2=0 | I2=0 | I2=1→0 | I2=0/1→0 | I2=1→0/1 |

FIG. 9 illustrates in timing diagram form a logical operation 143 of model 132 of FIG. 7, wherein write domain clock 82 and read domain clock 88 of the model operate on different frequencies. The timing diagram includes the following signals: input I1 38, input I2 40, WFFA1 84, WFFA2 86, RFFB1 90, RFFB2 92, XFFC1 122, XFFC2 124, MUX1 126, MUX2 128, RFFD1 94, RFFD2 96, write clock 82, read clock 88, and multiplexer selector 130. Since write clock 82 and read clock 88 operate on different frequencies in the illustrated example, the triggering edges of the clocks no longer always alternate between the read clock and the write clock. That is, there may be two or more consecutive triggering edges of the read clock between successive triggering edges of the write clock, or vice versa. In the illustrated example, there are two consecutive write clock triggering edges (WCLK2 and WCLK3) interspersed between two successive read clock triggering edges (RCLK1 and RCLK2).

The below Table V further represents, in tabular format, the logical values of the system inputs and read/write flip flops at each positive edge transition of write clock 82 and read clock 88 for logical operation 143 of model 132 illustrated in the timing diagram of FIG. 9. In contrast to FIG. 6., the delay register/multiplexer is inserted in read domain 34 rather than write domain 32 in this example. As a result, when two consecutive write clocks occur between read clocks, state transition information in write domain 32 may be lost, since the "capture" logic (e.g., the delay register/multiplexer) resides in the read domain and is clocked by the clock of the read domain.

Thus, inserting the delay register/multiplexer in read domain 34 when read domain clock 88 and write domain clock 82 are at different frequencies may produce incorrect results. The highlighted cells of Table V illustrate instances where the digital system of FIG. 7 yields an incorrect result (i.e., the result differs from the result of Table III). As a result, if clocks of differing frequencies are employed in the read and write domains of a digital system, the "capture" logic should preferably be inserted into write domain 32 rather than the read domain 34.

TABLE V

| | Input | WFF (level A) | RFF (level B) | Extend FF (level C) | Mux | RFF (level D) |
|---|---|---|---|---|---|---|
| Initial | I1=0 | I1=0 | I1=0 | I1=0 | I1=0 | I1=0 |
| | I2=0 | I2=0 | I2=0 | I2=0 | I2=0 | I2=0 |
| WCLK1 | I1=0 | I1=0 | I1=0 | I1=0 | I1=0 | I1=0 |
| | I2=1 | I2=0→1 | I2=0 | I2=0 | I2=0 | I2=0 |
| RCLK1 | I1=1 | I1=0 | I1=0 | I1=0 | I1=0/0 | I1=0 |
| | I2=1 | I2=1 | I2=0→1 | I2=0 | I2=0→1/0 | I2=0 |
| WCLK2 | I1=1 | I1=0→1 | I1=0 | I1=0 | I1=0 | I1=0 |
| | I2=1 | I2=1 | I2=1 | I2=0 | I2=1/0 | I2=0 |
| WCLK3 | I1=1 | I1=1 | I1=0 | I1=0 | I1=0 | I1=0 |
| | I2=0 | I2=1→0 | I2=1 | I2=0 | I2=1/0 | I2=0 |
| RCLK2 | I1=1 | I1=1 | I1=0→1 | I1=0 | I1=0→1/0 | I1=0 |
| | I2=0 | I2=1→0 | I2=1→0 | I2=0→1 | I2=1→0/0→1 | I2=1/0 |
| WCLK4 | I1=0 | I1=1→0 | I1=1 | I1=0 | I1=1/0 | I1=0 |
| | I2=0 | I2=0 | I2=1→0 | I2=1 | I2=1→0/1 | I2=1/0 |
| RCLK3 | I1=0 | I1=0 | I1=1→0 | I1=0→1 | I1=1→0/0→1 | I1=0→1/0 |
| | I2=1 | I2=0 | I2=0 | I2=1→0 | I2=0/1→0 | I2=1→0/0→1 |
| WCLK5 | I1=0 | I1=0 | I1=0 | I1=1 | I1=0/1 | I1=1/0 |
| | I2=1 | I2=0→1 | I2=0 | I2=0 | I2=0 | I2=0/1 |
| RCLK4 | I1=0 | I1=0 | I1=0 | I1=1→0 | I1=0/1→0 | I1=1→0/0→1 |
| | I2=1 | I2=1 | I2=0→1 | I2=0 | I2=0→1/0 | I2=0/1→0 |

Figure 10:
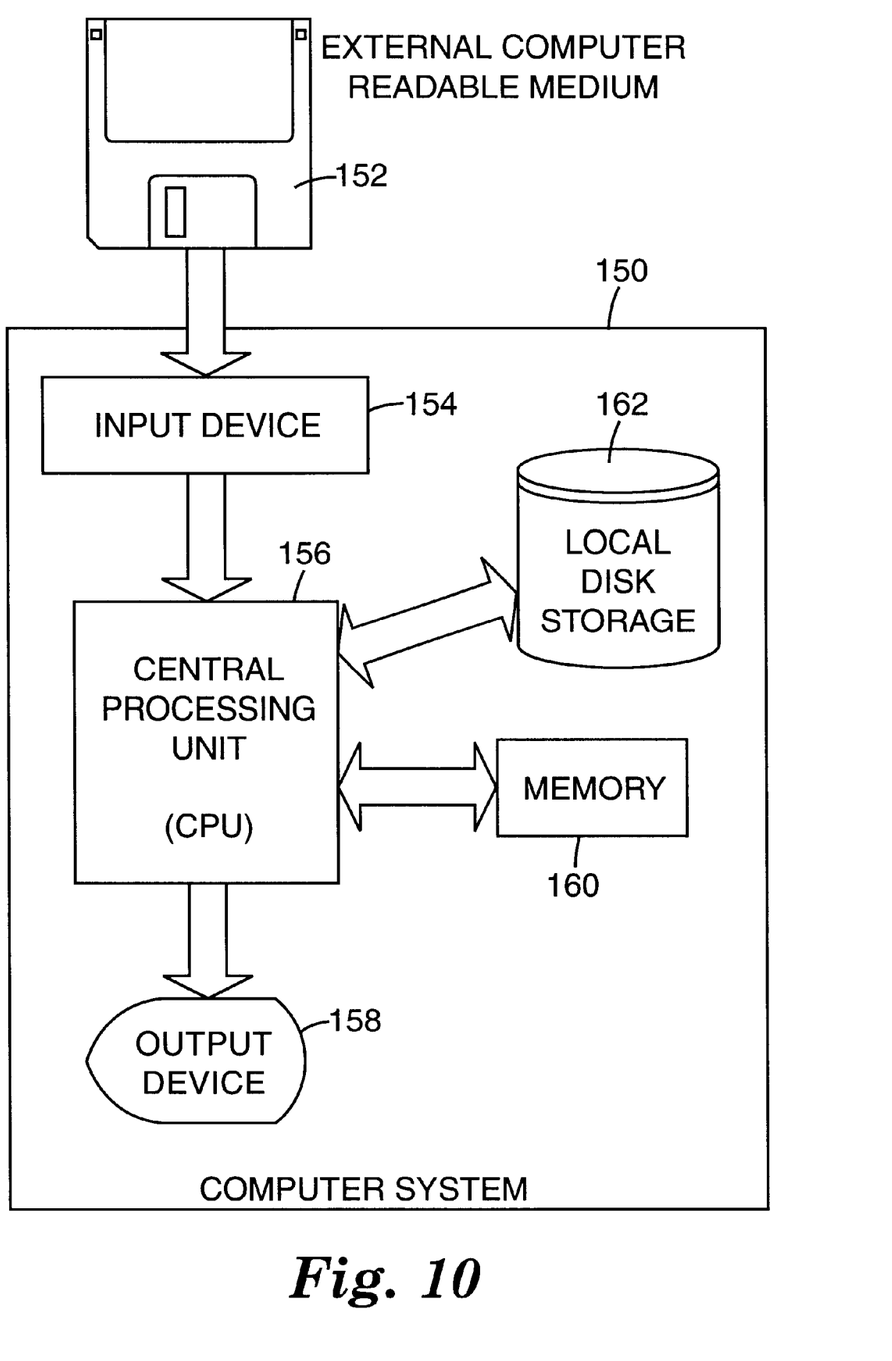
FIG. 10 is a block diagram of a computer system and a corresponding computer readable medium incorporating a function for verifying the functional behavior of a digital system in accordance with the present invention.

FIG. 10 illustrates a computer system 150 and an external computer readable medium 152 incorporating a method for verifying the asynchronous boundary behavior of a digital system. Embodiments of external computer readable medium 152 include, but are not limited to: a CD-ROM, a floppy disk, and a disk cartridge. The method for verifying the asynchronous boundary behavior of a digital system of the present invention can be implemented in a variety of compiled and interpreted computer languages. External computer readable medium 152 stores source code, object code, executable code, shell scripts and/or dynamic link libraries for the method for verifying the asynchronous boundary behavior of a digital system. An input device 154 reads external computer readable medium 152 and provides this data to computer system 150. Embodiments of input device 154 include but are not limited to: a CD-ROM reader, a floppy disk drive, and a data cartridge reader.

Computer system 150 includes a central processing unit 156 for executing the method for verifying the asynchronous boundary behavior of a digital system according to the present invention. Computer system 150 also includes local disk storage 162 for locally storing the functional testing system before, during and after execution. Method for verifying the asynchronous boundary behavior of a digital system also utilizes memory 160 within the computer system during execution. Upon execution of the method for verifying the asynchronous boundary behavior of a digital system, output data is produced and directed to an output device 158. Embodiments of output device 158 include, but are not limited to: a computer display device, a printer, and/or a disk storage device.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the electrical and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An apparatus for verifying the functional behavior of a digital system, the digital system including a first series of interconnected registers clocked by a first clock and a second series of interconnected registers clocked by a second clock, wherein an asynchronous boundary is formed at a coupling between the first series of interconnected registers and the second series of interconnected registers, the apparatus comprising:

a delay register coupled to an output of a predetermined register which is predetermined from a group of registers including the last register of the first group of interconnected registers and all registers from the second group of interconnected registers, wherein the delay register is clocked by the same clock as the predetermined register;

a multiplexer, including:
   at least two multiplexer inputs coupled to the output of the predetermined register and an output of the delay register,
   a multiplexer output coupled to an input of a next register in the second series of interconnected registers,
   a multiplexer input selector, and a selector coupled to the multiplexer input selector for selecting which of the at least two multiplexer inputs to pass through to the multiplexer output.

2. The apparatus of claim 1, wherein the selector is a pseudo-random signal generator.

3. The apparatus of claim 2, wherein the pseudo-random signal generator is disabled if a triggering edge of the first clock occurs at least a predetermined time interval from the triggering edge of the second clock.

4. The apparatus of claim 1, wherein the first clock and the second clock operate at approximately the same frequency.

5. An apparatus for verifying an asynchronous boundary behavior of a digital system, the digital system including a first register clocked by a first clock, and a second register clocked by a second clock, the apparatus comprising:
  a delay register coupled to an output of the first register, wherein the delay register is clocked by the first clock;
  a multiplexer, including:
    at least two multiplexer inputs coupled to the output of the first register and an output of the delay register,
    a multiplexer output coupled to an input of the second register,
    a multiplexer input selector; and
  a selector coupled to the multiplexer input selector for selecting which of the at least two multiplexer inputs to pass through to the multiplexer output.

6. The apparatus of claim 5, wherein the selector is a pseudo-random signal generator.

7. The apparatus of claim 6, wherein the pseudo-random signal generator is disabled if a triggering edge of the first clock occurs at least a predetermined time interval from the triggering edge of the second clock.

8. The apparatus of claim 5, wherein the first clock and the second clock operate at approximately the same frequency.

9. An apparatus for verifying an asynchronous boundary behavior of a digital system, the digital system including a first register clocked by a first clock, and a series of second registers clocked by a second clock, the apparatus comprising:
  a delay register coupled to an output of one of the series of second registers, wherein the delay register is clocked by the second clock;
  a multiplexer, including
    at least two multiplexer inputs coupled to the output of the one of the series of second registers and an output of the delay register,
    a multiplexer output coupled to an input of a next register in the series of second registers,
    a multiplexer input selector; and
  a selector coupled to the multiplexer input selector for selecting which of the at least two multiplexer inputs to pass through to the multiplexer output.

10. The apparatus of claim 9, wherein the selector is a pseudo-random signal generator.

11. The apparatus of claim 10, wherein the pseudo-random signal generator is disabled if a triggering edge of the first clock occurs at least a predetermined time interval from the triggering edge of the second clock.

12. An apparatus for verifying the functional behavior of a digital system, the digital system including a series of registers, wherein the series of registers includes a first register clocked by a first clock coupled to a second register clocked by a second clock, the apparatus comprising:
  a delay register coupled to an output of a predetermined register which is predetermined from the group comprising the first register and all registers following the first register in the series of registers, wherein the delay register is clocked by the same clock as the predetermined register;
  a multiplexer, including:
    at least two multiplexer inputs coupled to the output of the predetermined register and an output of the delay register,
    a multiplexer output coupled to a register following the predetermined register in the series of registers,
    a multiplexer input selector; and
  a selector coupled to the multiplexer input selector for selecting which of the at least two multiplexer inputs to pass through to the multiplexer output.

13. The apparatus of claim 12, wherein the selector is a pseudo-random signal generator.

14. The apparatus of claim 13, wherein the pseudo-random signal generator is disabled if a triggering edge of the first clock occurs at least a predetermined time interval from the triggering edge of the second clock.

15. The apparatus of claim 12, wherein the first clock and the second clock operate at approximately the same frequency.

16. A method for verifying an asynchronous boundary behavior of a digital system, the digital system including a first series of interconnected registers clocked by a first clock and a second series of interconnected registers clocked by a second clock, wherein an asynchronous boundary is formed at a coupling between the first series of interconnected registers and the second series of interconnected registers, the method comprising the steps of:
  coupling a delay register to an output of a predetermined register which is predetermined from a group of registers including the last register of the first group of interconnected registers and all registers from the second group of interconnected registers;
  coupling at least two inputs of a multiplexer to the output of the predetermined register and an output of the delay register;
  coupling an output of the multiplexer to an input of a next register in the second series of registers;
  coupling a selector to the multiplexer for selecting which of the multiplexer inputs to pass through to the multiplexer output;
  clocking the delay register by the same clock used to clock the predetermined register; and
  activating the selector to select which of the at least two multiplexer inputs to pass through to the multiplexer output.

17. The method of claim 16, wherein the selector is a pseudo-random signal generator.

18. The method of claim 17, wherein the pseudo-random signal generator is disabled if a triggering edge of the first clock occurs at least a predetermined time interval from the triggering edge of the second clock.

19. The method of claim 16, wherein the first clock and the second clock operate at approximately the same frequency.

20. A computer readable medium containing instructions for controlling a computer system to perform a method for verifying the functional behavior of a digital system, the digital system including a first series of interconnected registers clocked by a first clock and a second series of interconnected registers clocked by a second clock, wherein an asynchronous boundary is formed at a coupling between the first series of interconnected registers and the second series of interconnected registers, comprising the steps of:
  coupling at least two inputs of a multiplexer to the output of the predetermined register and an output of the delay register;
  coupling an output of the multiplexer to an input of a next register in the second series of registers;
  coupling a selector to the multiplexer for selecting which of the multiplexer inputs to pass through to the multiplexer output;
  clocking the delay register by the same clock used to clock the predetermined register; and
  activating the selector to select which of the multiplexer inputs to pass through to the multiplexer output.

* * * * *